(12) United States Patent
Lin

(10) Patent No.: US 6,598,666 B2
(45) Date of Patent: Jul. 29, 2003

(54) CPU COOLING ARRANGEMENT

(75) Inventor: Shih-Jen Lin, Taipei (TW)

(73) Assignee: Global Win Technology Co., Ltd., Taipei (TW)

( * ) Notice: Subject to any disclaimer, the term of this patent is extended or adjusted under 35 U.S.C. 154(b) by 0 days.

(21) Appl. No.: 10/067,246

(22) Filed: Feb. 7, 2002

(65) Prior Publication Data

US 2002/0189789 A1 Dec. 19, 2002

(30) Foreign Application Priority Data

Jun. 18, 2001 (TW) ........................... 90210235 U

(51) Int. Cl.[7] ................................................ H05K 7/20
(52) U.S. Cl. .................. 165/80.3; 165/121; 165/185; 174/16.3; 257/722; 361/697; 361/704
(58) Field of Search ................. 165/80.3, 121, 165/122, 185; 174/16.3; 257/718, 719, 722; 361/695, 697, 704

(56) References Cited

U.S. PATENT DOCUMENTS

| | | | | |
|---|---|---|---|---|
| 3,611,107 A | * | 10/1971 | Ruckel | 257/722 |
| 3,766,977 A | * | 10/1973 | Pravda et al. | 165/185 |
| 5,195,576 A | * | 3/1993 | Hatada et al. | 165/80.3 |
| 5,509,465 A | * | 4/1996 | Lai | 165/80.3 |
| 5,598,322 A | * | 1/1997 | Von Arx et al. | 361/704 |
| 5,678,627 A | * | 10/1997 | Lee | 165/80.3 |
| 6,181,556 B1 | * | 1/2001 | Allman | 361/697 |
| 6,308,773 B2 | * | 10/2001 | Lin | 165/80.3 |
| 6,407,919 B1 | * | 6/2002 | Chou | 361/697 |
| 6,435,467 B1 | * | 8/2002 | Lai | 165/80.3 |

FOREIGN PATENT DOCUMENTS

JP            04294570 A    * 10/1992  ............ 257/722

* cited by examiner

Primary Examiner—Leonard R Leo
(74) Attorney, Agent, or Firm—Bacon & Thomas, PLLC

(57) ABSTRACT

A CPU cooling arrangement is constructed to include a heat sink fastened to a CPU holder and disposed in contact with the CPU in the CPU holder, the heat sink having a vertically extended solid base and longitudinal radiation fins at two sides of the solid base, two fans respectively vertically mounted on the radiation fins at two sides of the heat sink, and resilient metal fastening wire rods respectively hung on the heat sinks at two sides and hooked in respective mounting holes of the fan to secure the fans to the heat sink.

4 Claims, 6 Drawing Sheets

CPU COOLING ARRANGEMENT

BACKGROUND OF THE INVENTION

1. Field of the Invention

The present invention relates to a CPU cooling arrangement and, more particularly, to such a CPU cooling arrangement in which two fans are mounted on radiation fins of a heat sink at two sides in a vertical position and driven to induce currents of air toward the gaps in the heat sink from two sides to efficiently carry heat from the heat sink and the CPU to a CPU holder below the heat sink.

2. Description of the Related Art

Advanced and sophisticated computers have been continuously developed. During operation of a computer, the CPU of the computer produces much heat. In order to keep the environment under the designed working temperature, heat must be quickly carried away from the CPU. A variety of heat sinks have been disclosed for use with fans to dissipate heat from the CPU of a computer. FIG. 5 shows a CPU cooling arrangement according to the prior art. According to this arrangement, the heat sink is mounted on the CPU holder in close contact with the CPU in the CPU holder, and a fan is supported on the topside of the heat sink and controlled to induce downward currents of air toward the bottom panel of the heat sink. This design does not allow cooling air to pass to the CPU or the electronic components around the CPU holder directly. Furthermore, this design requires much vertical installation space. FIG. 6 shows another design of CPU cooling arrangement according to the prior art. According to this design, the fan is mounted on one side of the heat sink in vertical and driven to induce horizontal currents of air. This design is still not satisfactory in function. Because currents of air directly pass from one side of the heat sink to the other side, cooling air is prohibited from passing to the CPU and the electronic components around the CPU holder. Further, because the radiation fins are upwardly extended from the flat bottom panel of the heat sink, the total heat dissipation area of the heat sink is limited.

SUMMARY OF THE INVENTION

The present invention has been accomplished to provide a CPU cooling arrangement, which eliminates the aforesaid drawbacks. It is one object of the invention to provide a CPU cooling structure, which guides air from the fan horizontally toward the center of the heat sink from two sides and then vertically toward the top and bottom sides of the heat sink to efficiently carry heat away from the CPU. According to the present invention, the CPU cooling arrangement comprises a heat sink fastened to a CPU holder and disposed in contact with the CPU in the CPU holder, the teat sink having a vertically extended solid base and longitudinal radiation fins at two sides of the solid base, two fans respectively vertically mounted on the radiation fins at two sides of the heat sink, and resilient metal fastening wire rods respectively hung on the heat sinks at two sides and hooked in respective mounting holes of the fan to secure the fans to the heat sink. When the fan is started during operation of the CPU, heat is transferred from the CPU to the radiation fins of the heat sink, and currents of air pass from the fans to the gaps in between the radiation fins toward the solid base of the heat sink, a portion of said currents then being guided by the solid base upwards to the outside to carry heat away from the radiation fins, and a portion of said currents being guided downwards toward the CPU and the electronic components around the CPU holder to carry heat away from the CPU and the electronic components directly.

DETAILED DESCRIPTION OF THE PREFERRED EMBODIMENT

Figure 1:
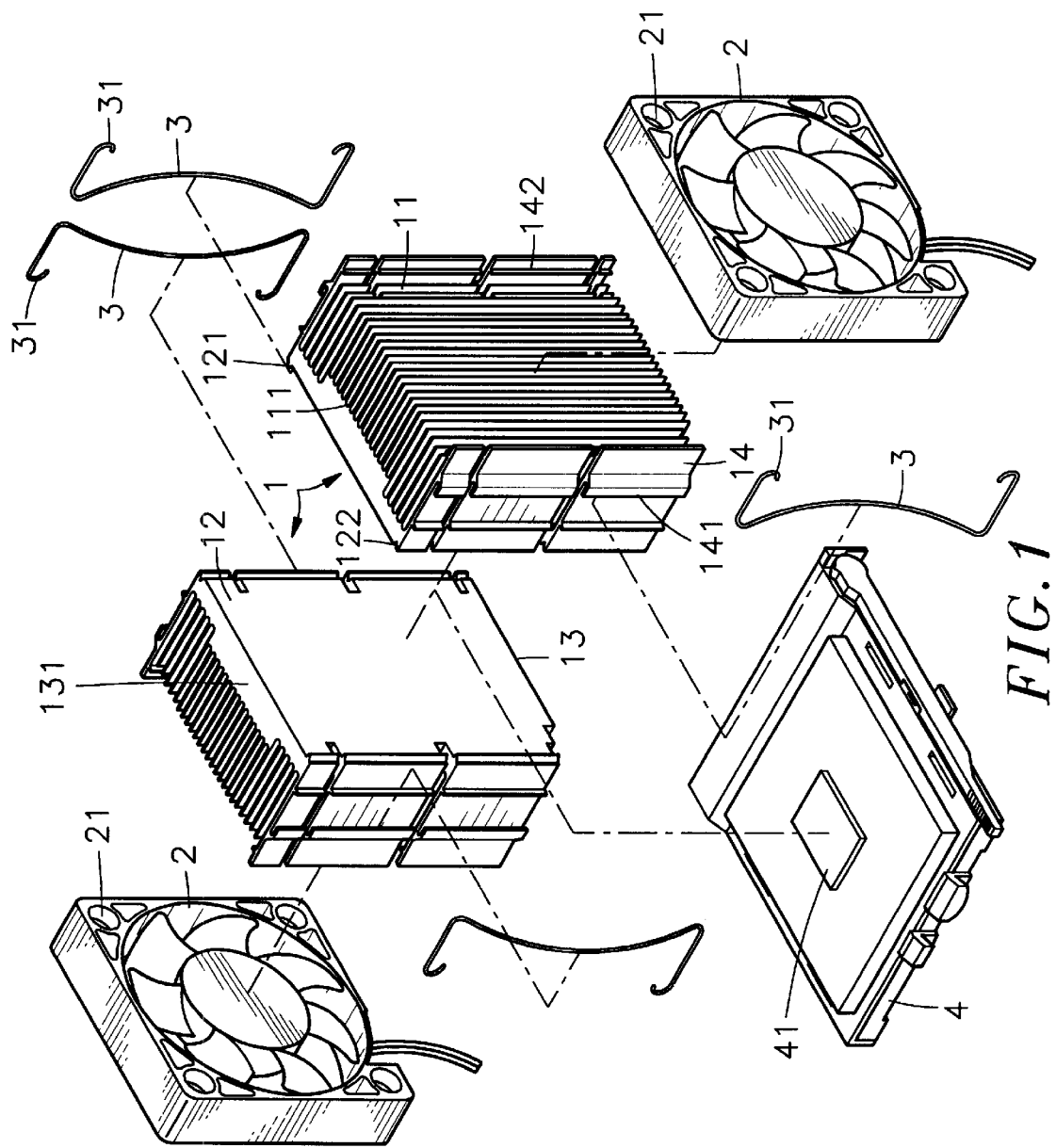
FIG. 1 is an exploded view of a CPU cooling arrangement according to the present invention.
Figure 2:
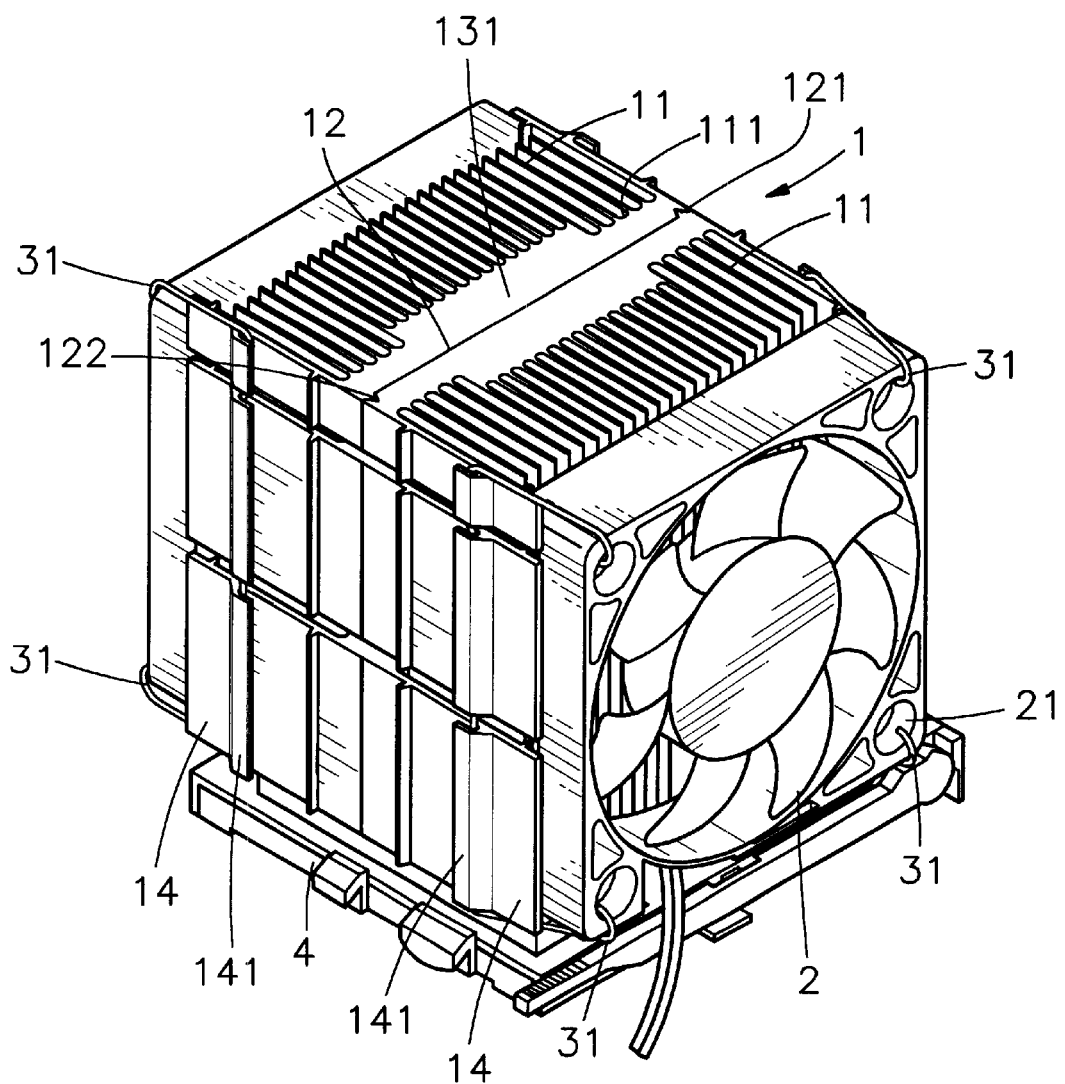
FIG. 2 is an assembly view of the CPU cooling arrangement according to the present invention.

Referring to FIGS. 1 and 2, a CPU cooling arrangement is shown comprised of two heat sinks 1, two fans 2, four resilient metal fastening wire rods 3, and a CPU holder 4 holding a CPU 4. The heat sinks 1 are symmetrical, each comprising a vertically extended solid base 131, two side panels 14 disposed at two opposite lateral sides of the solid base 131, a flat bottom contact face 13 disposed at the bottom side of the solid base 131, parallel radiation fins 11 perpendicularly extended from one side of the solid base 131 between the side panels 14, retaining rods 121 and retaining holes 122 at the other side, namely, the coupling side 12 of the solid base 131, two hooked flanges 141 respectively longitudinally protruded from the outer sides of the side panels 14, and two bearing flanges 142 respectively outwardly extended from the side panels 14. By means of plugging the retaining rods 121 of one heat sink 1 into the retaining holes 122 of the other, the heat sinks 1 are fastened together with the respective coupling sides 12 closely attached to each other. The fans 2 are respectively supported on the radiating fins 11 of the heat sinks 1 between the respective bearing flanges 142 of the heat sinks 1. The resilient metal fastening wire rods 3 are respectively coupled to the hooked flanges 141 of the heat sinks 1, each having two hooked end pieces 31 respectively extended out of the top and bottom ends of the respective hooked flanges 141 and respectively hooked in respective mounting holes 21 of the fans 2 to secure the fans 2 to the heat sinks 1.

Figure 3:
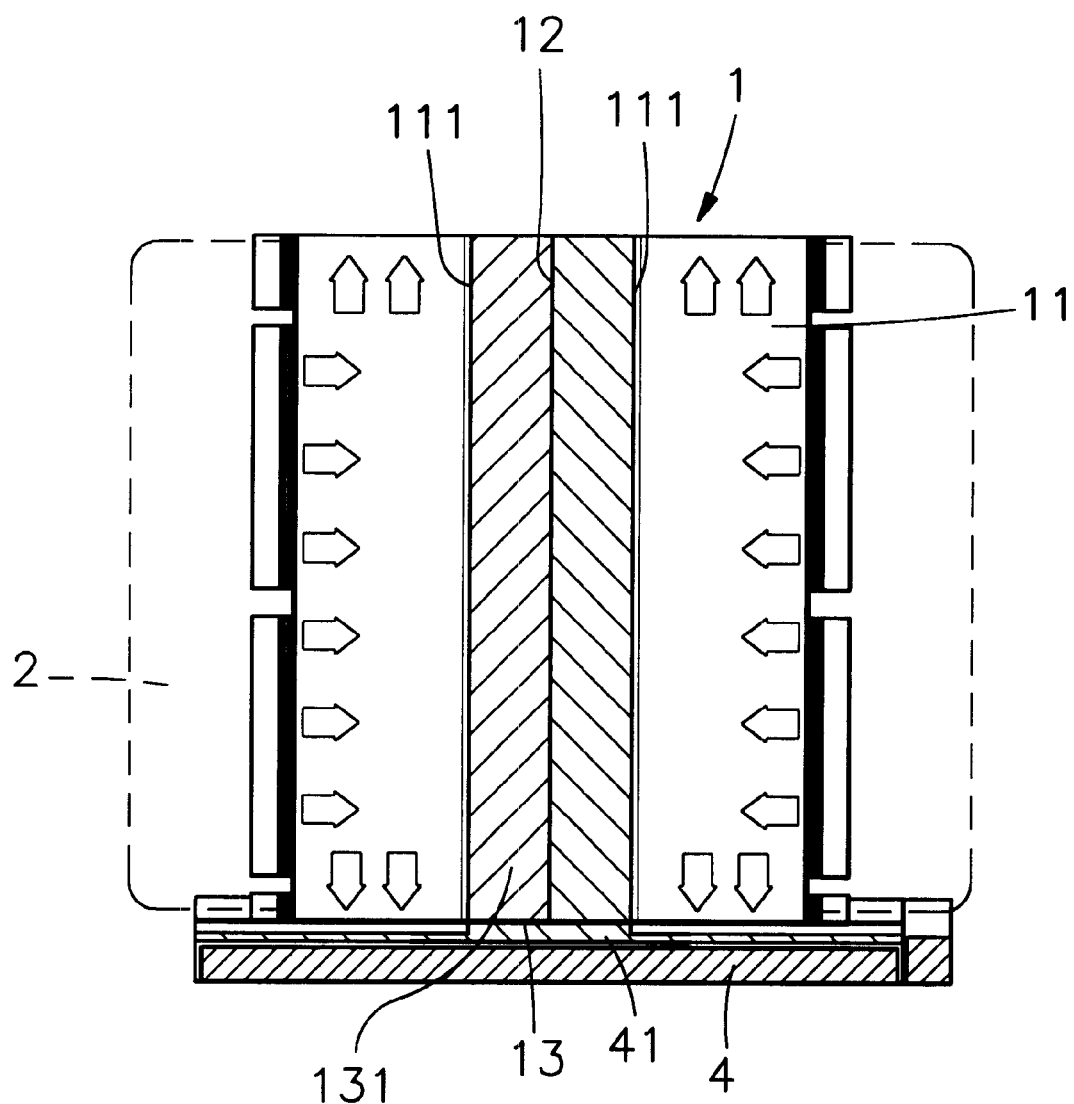
FIG. 3 is a sectional side view of the CPU cooling arrangement according to the present invention.

Referring to FIG. 3, the flat bottom contact faces 13 of the heat sinks 1 are maintained in close contact with the CPU 41 in the CPU holder 4 for transferring heat from the CPU 41 to the radiation fins 11 of the heat sink 1, enabling heat to be further carried away from the heat sinks by currents of air induced by the fans 2. The resilient metal fastening wire rods 3 secure the fans 2 to the vertical radiation fins 11 that extend perpendicularly from bases 131 of the heat sinks 1, keeping the horizontal fan axis of each fan 2 in parallel to the CPU 41 and CPU holder 4. During operation, currents of air pass horizontally from the fans 2 to gaps 111 in between the vertical radiation fins 11 toward the solid base 131, and the are stopped by the solid base 131 and forced to pass downwardly as well as outwardly out of the heat sinks 1, enabling heat to be quickly carried away from the heat sinks 1. Further, the downward flowing currents of air directly pass to the CPU 41 and the electronic components (not shown) around the CPU holder 4 to dissipate heat from the CPU 41 and the surrounding electronic components efficiently.

Figure 4:
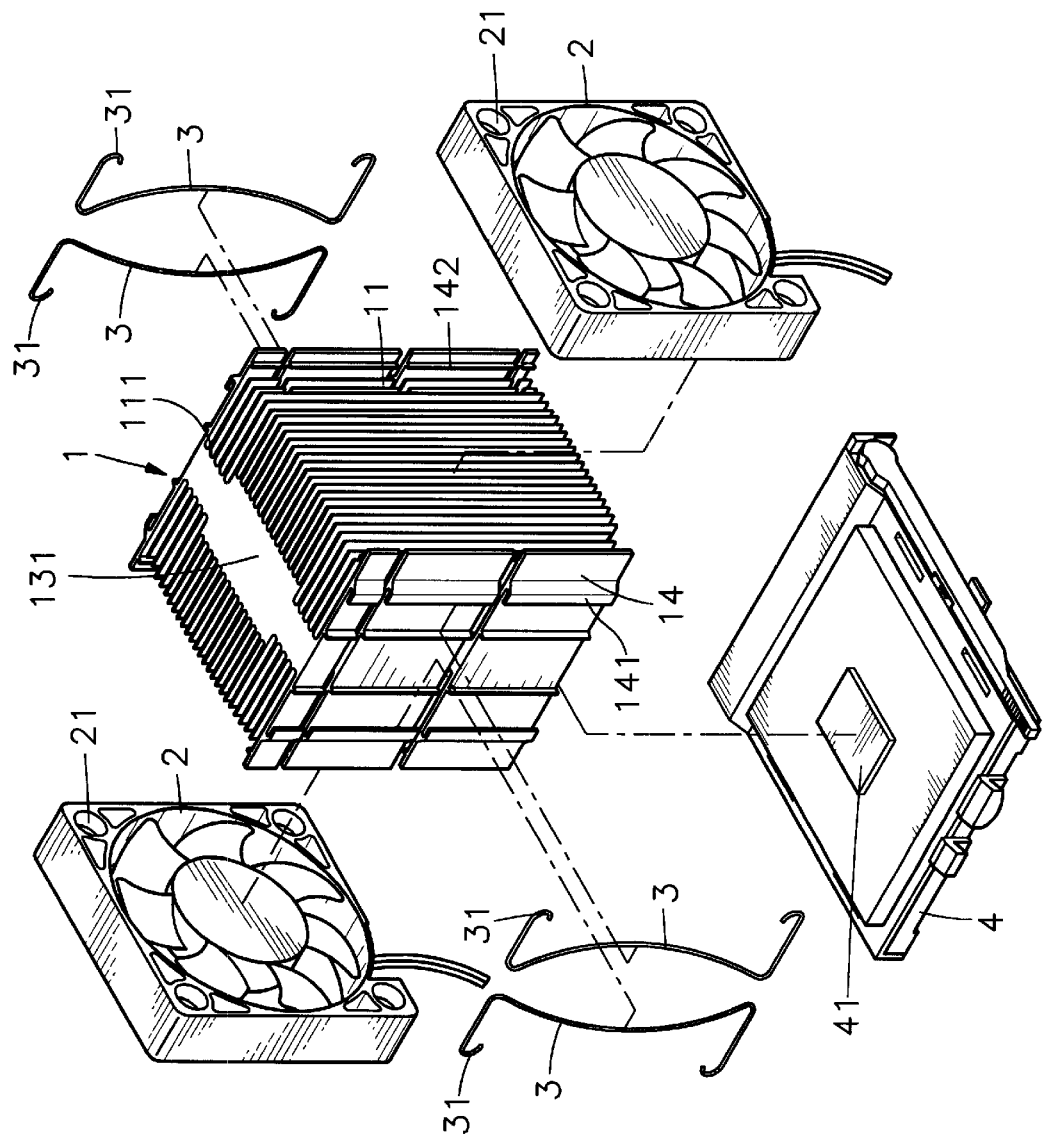
FIG. 4 is an exploded view of an alternate form of the CPU cooling arrangement according to the present invention.
Figure 5:
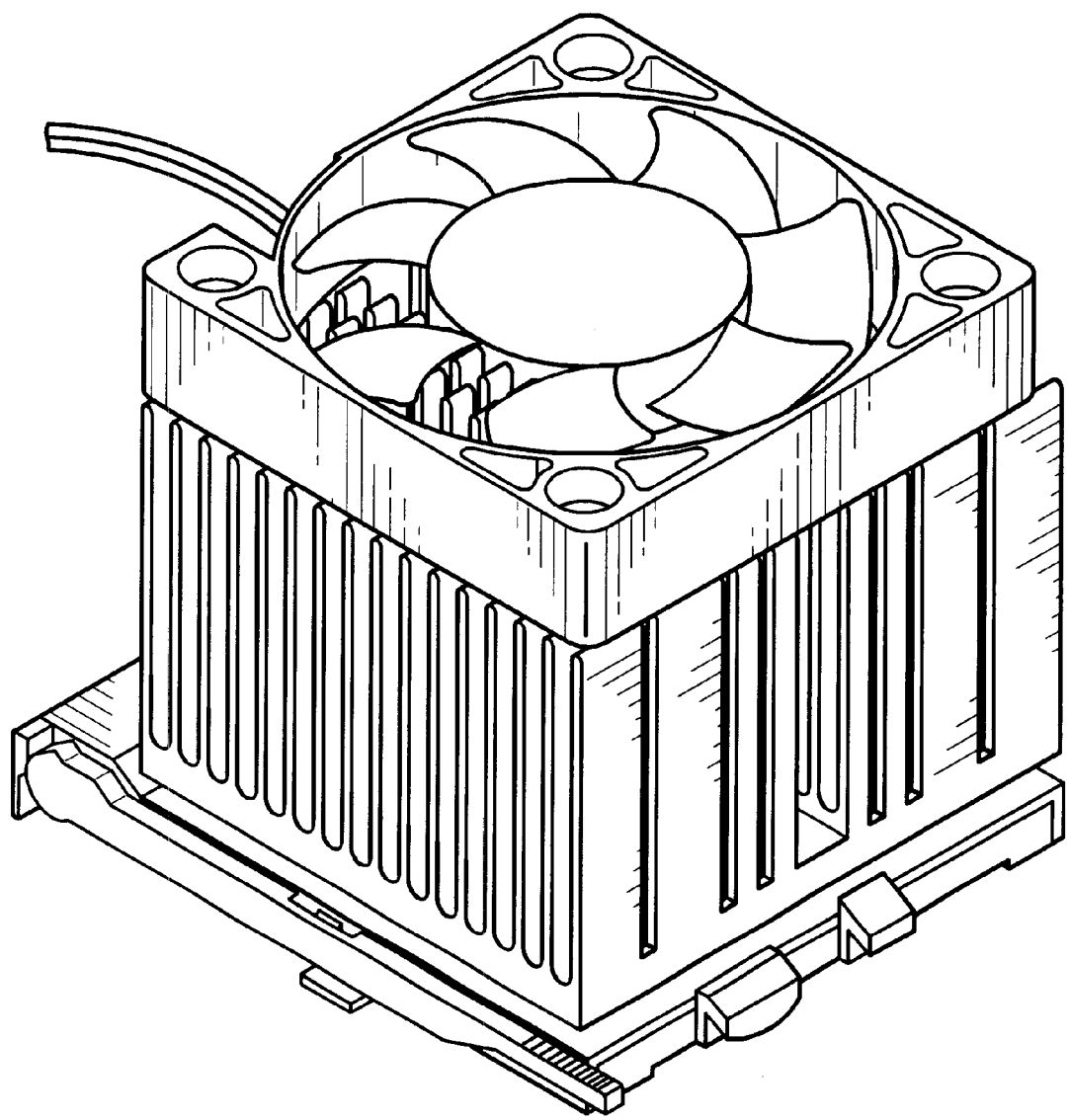
FIG. 5 is an elevational view of a CPU cooling arrangement according to the prior art.
Figure 6:
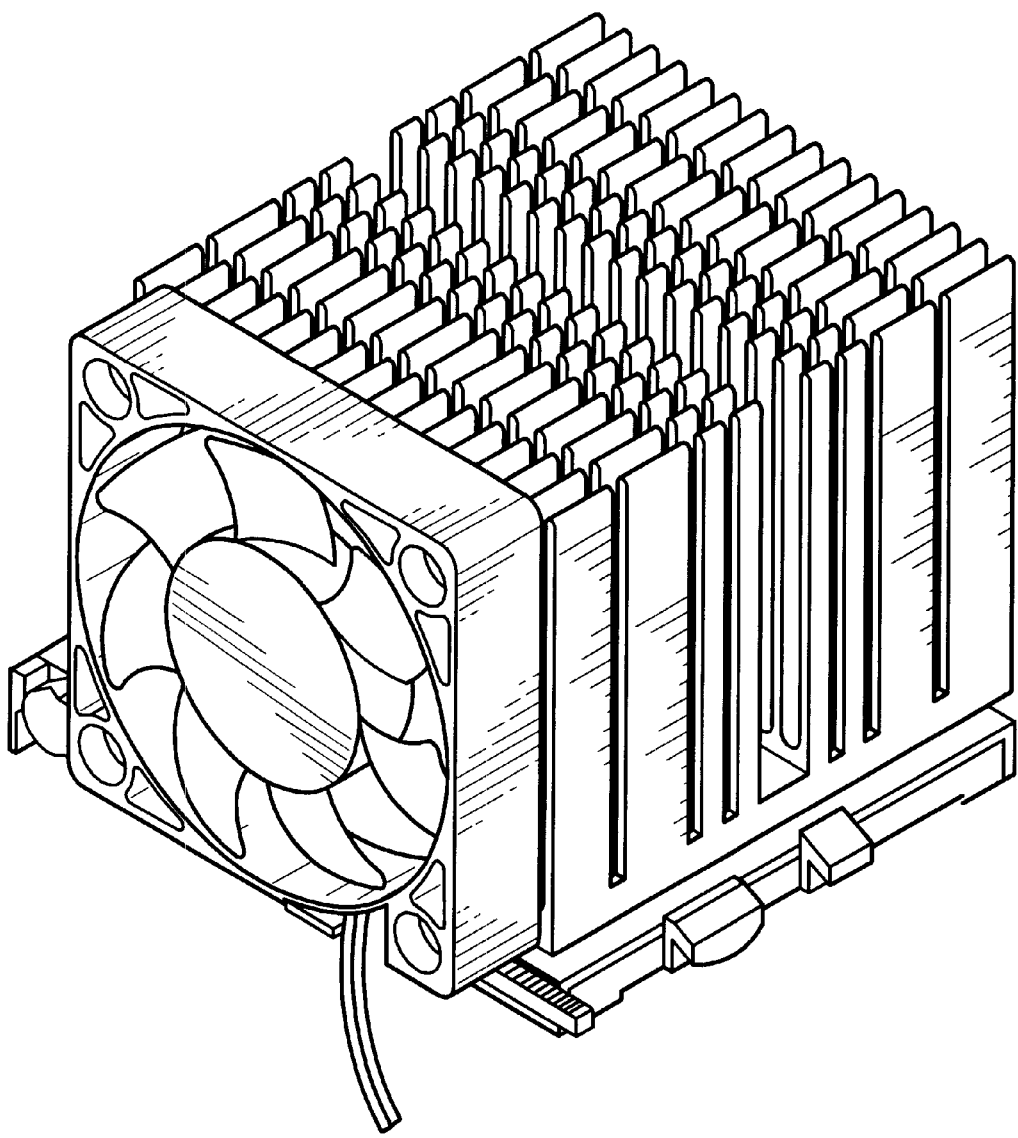
FIG. 6 is an elevational view of another design of CPU cooling arrangement according to the prior art.

FIG. 4 shows an alternative form of the CPU cooling arrangement according to the present invention. According to this alternate form, the heat sink is of a single piece design, i.e., the aforesaid two heat sinks 1 are formed integral with each other. According to this design, a heat sink bar is formed as a single unit, and then cut into individual heat sinks subject to the desired height.

A prototype of the CPU cooling arrangement has been constructed with the features of the annexed drawings of FIGS. 1–4. The CPU cooling arrangement functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A CPU cooling arrangement comprising a heat sink fastened to a CPU holder that holds a CPU, said heat sink being disposed in contact with the CPU in said CPU holder, and said heat sink comprising two heat sink units abutted against each other, said heat sink units each comprising a vertically extending solid base, a bottom contact face disposed at a bottom side of said solid base for contacting the CPU in said CPU holder, two side panels respectively disposed at two opposite lateral sides of said solid base, and vertical radiation fins perpendicularly extended from a front side of said solid base between said side panels, two fans respectively mounted on the radiation fins of said heat sink units of said heat sink, said fans having horizontal axes extending in parallel with the CPU holder so that air first flows horizontally between the fins from the fans to the solid base, a portion of said air then flowing downwardly between the fins toward the CPU holder to directly carry heat away from components on the CPU holder, and a portion of said air flowing upward and outward to carry heat away from said heat sink, and further comprising fastening means adapted for securing said fans to said heat sink units of said heat sink.

2. The CPU cooling arrangement as claimed in claim 1, wherein said side panels of said heat sink units of said heat sink each comprise a longitudinally extended hooked flange and a longitudinally extended bearing flange; said fans are respectively mounted on the radiation fins of said heat sink units of said heat sink and stopped between the bearing flanges of the side panels of said heat sink units of said heat sink, each having a plurality of mounting holes in corners thereof; said fastening means comprises a plurality of resilient metal fastening wire rods respectively coupled to the hooked flanges of said side panels of said heat sink units of said heat sink, said resilient metal fastening wire rods each having two hooked end tips respectively hooked in the mounting holes of said fans to secure said fans to said heat sink units of said heat sink.

3. The CPU cooling arrangement as claimed in claim 2, wherein the coupling sides of the solid bases of said heat sink units of said heat sink have respective retaining rods and retaining holes for enabling the solid bases of said heat sink units of said heat sink to be fastened together by plugging the respective retaining rods into the respective retaining holes.

4. The CPU cooling arrangement as claimed in claim 1, wherein the solid bases of said heat sink units of said heat sink each have a coupling side abutted against each other.

* * * * *